(12) United States Patent
Lin

(10) Patent No.: US 12,112,822 B2
(45) Date of Patent: Oct. 8, 2024

(54) MULTI-CHANNEL MEMORY DEVICE CAPABLE OF SWITCHING REDUNDANCY MEMORY BLOCKS TO REPLACE FAILED MEMORY BLOCK

(71) Applicant: Winbond Electronics Corp., Taichung (TW)

(72) Inventor: Chih-Feng Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 191 days.

(21) Appl. No.: 17/903,052

(22) Filed: Sep. 6, 2022

(65) Prior Publication Data

US 2023/0215509 A1 Jul. 6, 2023

(30) Foreign Application Priority Data

Jan. 3, 2022 (TW) .................................. 111100043

(51) Int. Cl.
*G11C 29/00* (2006.01)
*G11C 29/52* (2006.01)

(52) U.S. Cl.
CPC ............ *G11C 29/52* (2013.01); *G11C 29/781* (2013.01); *G11C 29/785* (2013.01)

(58) Field of Classification Search
CPC ...... G11C 29/52; G11C 29/781; G11C 29/785
See application file for complete search history.

(56) References Cited

U.S. PATENT DOCUMENTS

| | | | | |
|---|---|---|---|---|
| 9,921,762 B2* | 3/2018 | Amidi | ................. | G06F 11/1612 |
| 11,803,444 B1* | 10/2023 | Steinmetz | ........... | G06F 11/1415 |
| 2010/0262764 A1* | 10/2010 | Liu | ..................... | G06F 12/0246 |
| | | | | 711/E12.001 |
| 2014/0108725 A1* | 4/2014 | Lee | ....................... | G06F 3/0619 |
| | | | | 711/114 |
| 2015/0036416 A1 | 2/2015 | Kim | | |
| 2022/0308969 A1* | 9/2022 | Tang | ..................... | G11C 29/76 |

* cited by examiner

*Primary Examiner* — Mushfique Siddique
(74) *Attorney, Agent, or Firm* — JCIPRNET

(57) ABSTRACT

A multi-channel memory device includes N first memory blocks, a first redundancy memory block, and N first interface circuits. Each of the first interface circuits is coupled to two of the first memory blocks and the first redundancy memory block. The first interface circuits respectively select N first selected memory blocks in the first memory block and the first redundancy memory block according to a plurality of first selection signals, where N is a positive integer greater than 1.

16 Claims, 6 Drawing Sheets

MULTI-CHANNEL MEMORY DEVICE CAPABLE OF SWITCHING REDUNDANCY MEMORY BLOCKS TO REPLACE FAILED MEMORY BLOCK

CROSS-REFERENCE TO RELATED APPLICATION

This application claims the priority benefit of Taiwan application serial no. 111100043, filed on Jan. 3, 2022. The entirety of the above-mentioned patent application is hereby incorporated by reference herein and made a part of this specification.

BACKGROUND

Technology Field

The disclosure relates to a multi-channel memory device, and particularly to a multi-channel memory device with repair capability.

Description of Related Art

In electronic devices, the demand for memory (e.g., dynamic random access memory) for system chips continues to develop in the direction of high speed and high bandwidth. The high-bandwidth dynamic random access memory chip requires a large number of input and output (I/O) interfaces. Therefore, according to the requirement, multi-channel memory devices have been developed, that is, memory blocks with multiple groups of independent channels in a chip. The capacity of a memory block of each channel is not large, but a large amount of data can be output at the same time. However, if something wrong happens to one of the memory blocks, or the common power supply appears abnormal, accordingly the entire chip may not work properly.

To solve the problems, the most straightforward method is to add a group of extra channel redundancy memory blocks and corresponding interface circuits, but this may cause problems for the memory controller. If with no additional interface circuits, it requires to add a data path remapping design, but this may result in a complexity of the internal wiring.

SUMMARY

The disclosure provides a multi-channel memory device capable of quickly switching redundancy memory blocks to replace failed memory blocks.

The multi-channel memory device of the disclosure includes N first memory blocks, a first redundancy memory block, and N first interface circuits. Each of the first interface circuits is coupled to two of the first memory blocks and the first redundancy memory block. The first interface circuits respectively select N first selected memory blocks in the first memory blocks and the first redundancy memory block to be coupled to multiple first input and output interfaces according to multiple first selection signals. N is a positive integer greater than 1.

In summary, multiple first interface circuits are disposed in the multi-channel memory device of the disclosure, and each of the first interface circuits is coupled to two of the first memory blocks and the first redundancy memory block. When one of the first memory blocks is failed, the first interface circuit can adjust the coupling state of the first memory block, the first redundancy memory block, and the first input and output interfaces, so that the first redundancy memory block can replace the failed first memory block.

DESCRIPTION OF THE EMBODIMENTS

Figure 1:
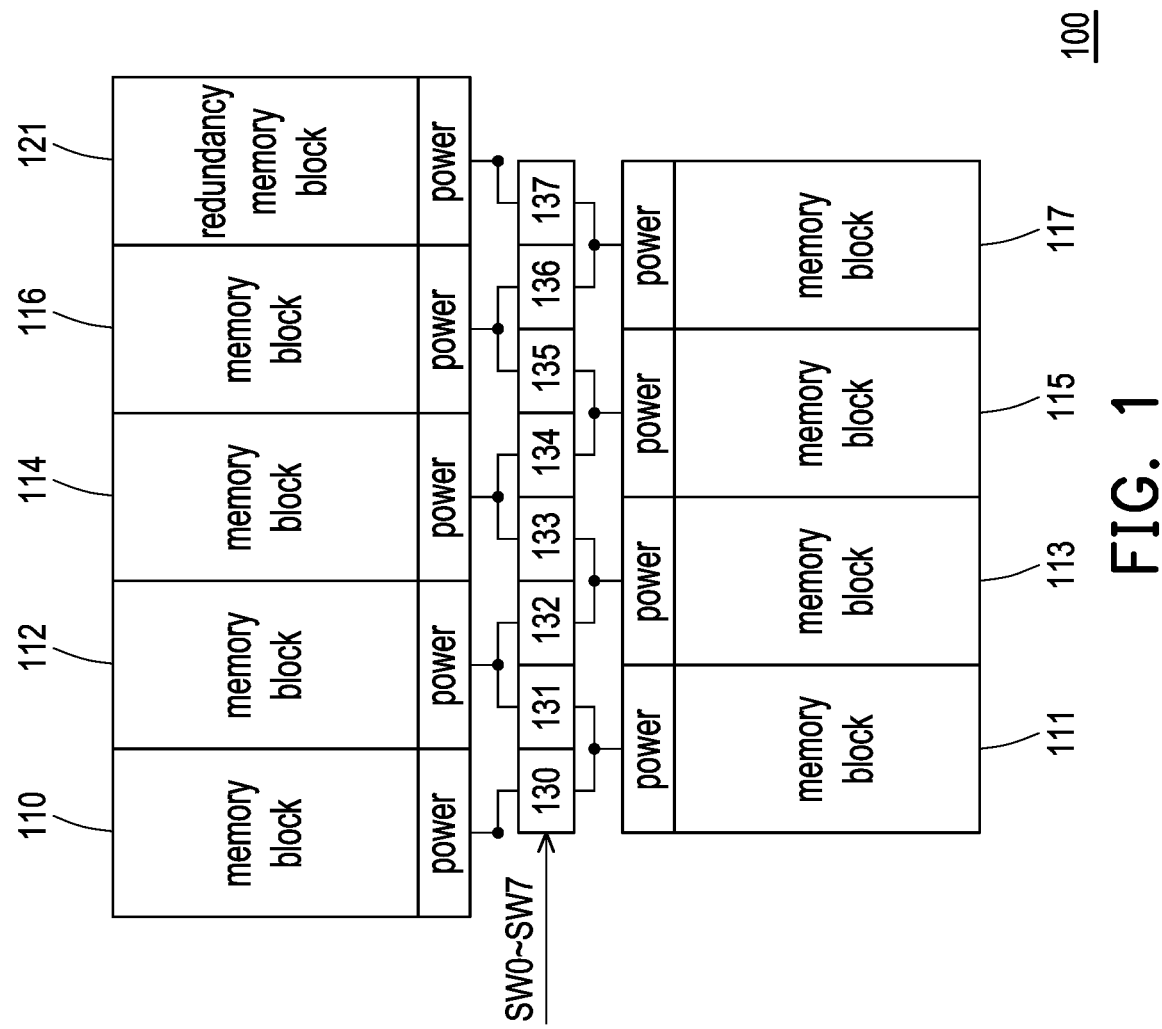
FIG. 1, FIG. 2, and FIG. 5 are schematic views of multi-channel memory devices, respectively according to different embodiments of the disclosure.

Referring to FIG. 1, FIG. 1 is a schematic view of a multi-channel memory device according to an embodiment of the disclosure. A multi-channel memory device 100 includes multiple memory blocks 110 to 117, a redundancy memory block 121, and multiple interface circuits 130 to 137. In the embodiment of the disclosure, the number of memory blocks 110 to 117 may be N, and N is a positive integer greater than 1. In the embodiment, N may be equal to 8. In addition, the number of the interface circuits 130 to 137 may be equal to the number of the memory blocks 110 to 117.

In the embodiment, the interface circuits 130 to 137 can be disposed in a row, and the memory blocks 110 to 117 are divided into two groups and disposed outside two sides of the interface circuits 130 to 137, respectively. The memory blocks 110, 112, 114, and 116 are disposed outside the first side of the interface circuits 130 to 137, and the memory blocks 111, 113, 115, and 117 are disposed outside the second side of the interface circuits 130 to 137. The memory blocks 110 to 117 of the embodiment can provide 8 memory channels, respectively.

Each of the interface circuits 130 to 137 is coupled to two of the memory blocks 110 to 117 and the redundancy memory block 121. The i-th interface circuits 130 to 136 are coupled to the i-th memory blocks 110 to 116 and the i+1-th memory blocks 111 to 117, and i is a positive integer greater than 0 and less than N. The N-th interface circuit 137 is coupled to the N-th memory block 117 and the redundancy memory block 121. The interface circuits 130 to 137 are coupled to multiple corresponding input and output interfaces, respectively. In the embodiment, the input and output interfaces may be solder pads.

In detail, the interface circuit 130 is coupled to the memory blocks 110 and 111; the interface circuit 131 is coupled to the memory blocks 111 and 112; the interface circuit 132 is coupled to the memory blocks 112 and 113; the interface circuit 133 is coupled to the memory blocks 113 and 114; the interface circuit 134 is coupled to the memory blocks 114 and 115; the interface circuit 135 is coupled to the memory blocks 115 and 116; the interface circuit 136 is coupled to the memory blocks 116 and 117; the interface circuit 137 is coupled to the memory block 117 and the redundancy memory block 121.

The interface circuits 130 to 137 receive multiple selection signals SW0 to SW7, respectively. The interface circuits 130 to 137 select one of two correspondingly coupled memory blocks (or, the memory block 117 and the spare memory area 121) to serve as the selected memory block according to the selection signals SW0 to SW7, respectively.

In addition, the selected memory block is coupled to the corresponding input and output interface.

The selection signals SW0 to SW7 can be generated according to the failure status of the memory blocks 110 to 117. When none of the memory blocks 110 to 117 is failed, the interface circuits 130 to 137 can select the memory blocks 110 to 117 to be coupled to the corresponding 8 solder pads, respectively according to the selection signals SW0 to SW7. When one of the memory blocks 110 to 117 is failed, the interface circuits 130 to 137 can select the failed memory block not to be coupled to any solder pad according to the selection signals SW0 to SW7 so that the not failed memory blocks are coupled to the first solder pad to the seventh solder pad in sequence, respectively, and the redundancy memory block 121 is coupled to the eighth solder pads.

Moreover, the eight memory blocks 110 to 117 in the embodiment are only examples for illustration. In the embodiment of the disclosure, the number of multiple memory blocks in the multi-channel memory device 100 is not limited to eight. In other embodiments of the disclosure, the number of memory blocks can be 8 or more or 8 or less with no fixed limit.

Figure 2:
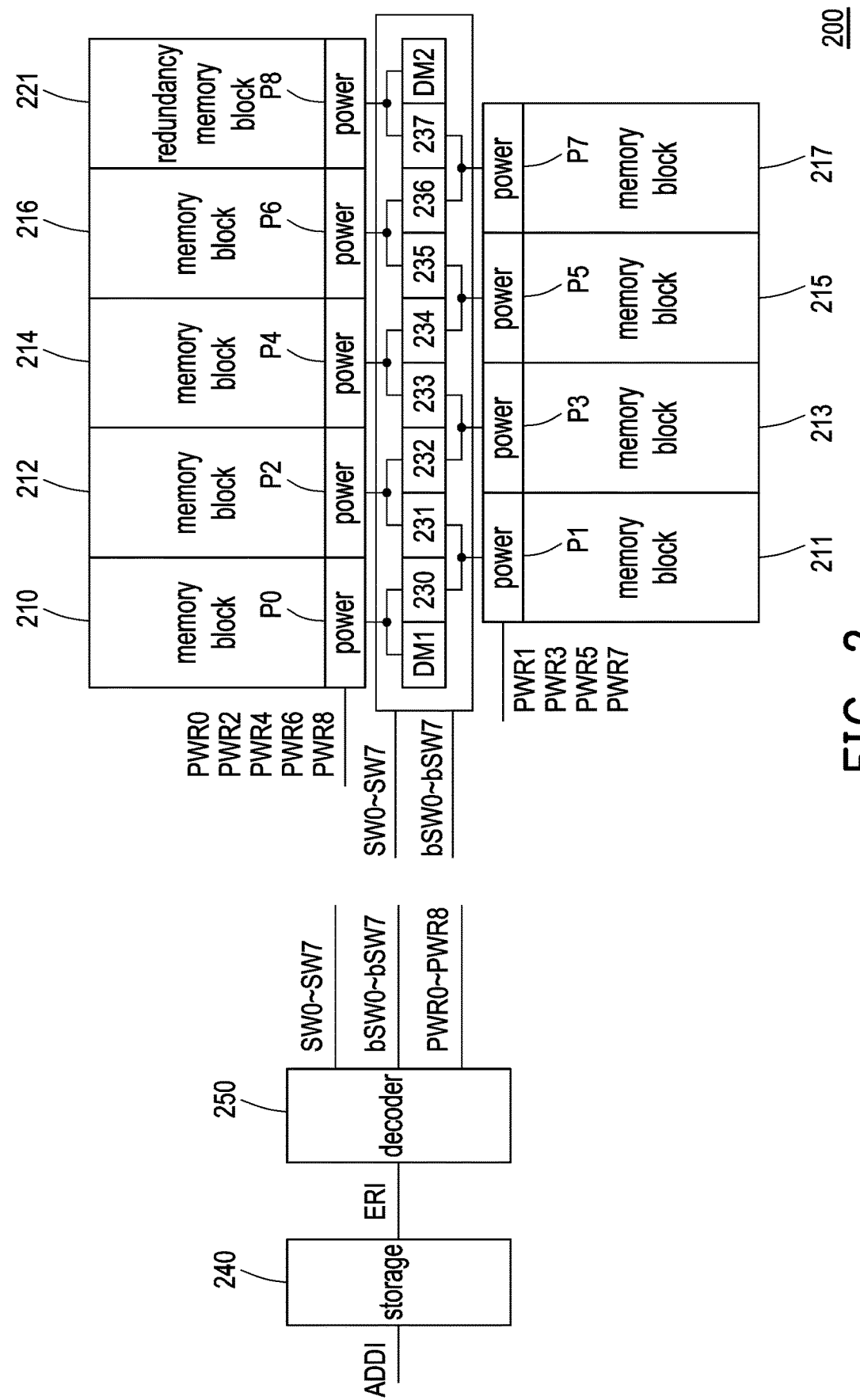

In the subsequent paragraphs, referring to FIG. 2, FIG. 2 is a schematic view of a multi-channel memory device according to another embodiment of the disclosure. A multi-channel memory device 200 includes multiple memory blocks 210 to 217, a redundancy memory block 221, multiple interface circuits 230 to 237, redundant interface circuits DM1 and DM2, a storage 240, and a decoder 250. In the embodiment, the storage 240 is configured to store a piece of error information ERI of the error status of each of the memory blocks 210 to 217. When one of the memory blocks 210 to 217 is tested to be failed, address information ADDI of the failed memory block can be written into the storage 240, and the storage 240 can provide the error information ERI according to the address Information ADDI.

The decoder 250 is coupled to the storage 240 for receiving the error information ERI and decoding the error information ERI to generate the selection signals SW0 to SW7. Further, the decoder 250 can generate reverse signals bSW0 to bSW7 of the selection signals SW0 to SW7 and power control signals PWR0 to PWR8 according to the selection signals SW0 to SW7. The power control signals PWR0 to PWR7 can be the same as the selection signals SW0 to SW7. When none of the memory blocks 210 to 217 is failed, the power control signal PWR8 can be a non-active logic level; by contrast, when one of the memory blocks 210 to 217 is failed, the power control signal PWR8 can be an active logic level.

In the embodiment, the coupling manners of the memory blocks 210 to 217, the redundancy memory blocks 221, and the interface circuits 230 to 237 are the same as those in the embodiment of FIG. 1, which are not repeated herein. Note that in the multi-channel memory device 200 of the embodiment, the redundant interface circuits DM1 and DM2 are disposed on two sides of the row formed by the interface circuits 230 to 237, respectively. The circuit structure of each of the redundant interface circuits DM1 and DM2 is the same as that of each of the interface circuits 230 to 237. Through the redundant interface circuits DM1 and DM2, the loads coupled to all the memory blocks 210 to 217 and the redundancy memory block 221 can be the same.

In addition, in the embodiment, the memory blocks 210 to 217 and the redundancy memory block 221 respectively have power channels to receive power P0 to P8. On the other hand, the memory blocks 210 to 217 and the redundancy memory block 221 can determine whether to receive power P0 to P8 respectively according to the power control signals PWR0 to PWR8.

When all memory blocks 210 to 217 are tested as normal, the decoder 250 decodes the error information ERI to generate the selection signals SW0 to SW7, the reverse signals bSW0 to bSW7 of the selection signals SW0 to SW7, and the power control signals PWR0 to PWR8. The selection signals SW0 to SW7 and the reverse signals bSW0 to bSW7 thereof are transmitted to the interface circuits 230 to 237, respectively, and the power control signals PWR0 to PWR8 are transmitted to the memory blocks 210 to 217 and the redundancy memory block 221, respectively. Meanwhile, the interface circuit 230 couples the memory block 210 to the corresponding solder pad; the interface circuit 231 couples the memory block 211 to the corresponding solder pad; the interface circuit 232 couples the memory block 212 to the corresponding solder pad; the interface circuit 233 couples the memory block 213 to the corresponding solder pad; the interface circuit 234 couples the memory block 214 to the corresponding solder pad; the interface circuit 235 couples the memory block 215 to the corresponding solder pad; the interface circuit 236 couples the memory block 216 to the corresponding solder pad; the interface circuit 237 couples the memory block 217 to the corresponding pad. In addition, the memory blocks 210 to 217 receive the power P0 to P7 according to the power control signals PWR0 to PWR7, respectively, and the redundancy memory block 221 cuts off the receiving channel of the power P8 according to the power control signal PWR8.

Figure 3:
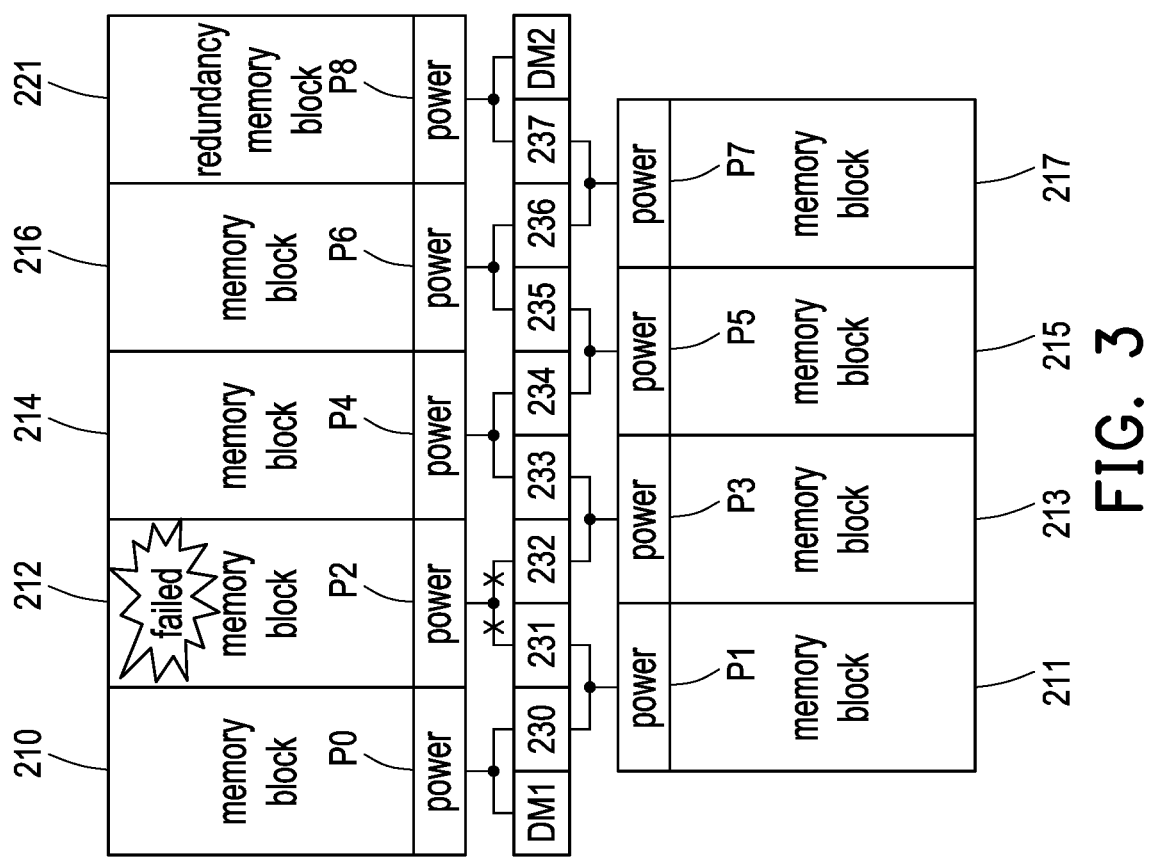
FIG. 3 is a schematic view of a repair operation of a multi-channel memory device according to an embodiment of the disclosure.

On the other hand, when one of the memory blocks 210 to 217 is tested to be failed, refer to FIG. 3 for a schematic view of the repair operation of the multi-channel memory device according to the embodiment of the disclosure. In FIG. 3, the memory block 212 is taken as an example to illustrate the failed memory block. According to the selection signals SW0 to SW7 and the reverse signals bSW0 to bSW7 thereof, the interface circuit 230 can select the memory block 210 to be coupled to the first solder pad; the interface circuit 231 can select the memory block 211 to be coupled to the second solder pad; the interface circuit 232 can select the memory block 213 to be coupled to the third solder pad; the interface circuit 233 can select the memory block 214 to be coupled to the fourth solder pad; the interface circuit 234 can select the memory block 215 to be coupled to the fifth solder pad; the interface circuit 235 can select the memory block 216 to be coupled to the sixth solder pad; the interface circuit 236 can select the memory block 217 to be coupled to the seventh solder pad; the interface circuit 237 can select the redundancy memory block 221 to be coupled to the eighth solder pad.

On the other hand, according to the power control signals PWR0 to PWR8, the power channel of the memory block 212 receiving the power P2 can be cut off. The power channels of the memory blocks 210 to 211 and 213 to 217 receiving power P0 to P1 and P3 to P7, respectively, and the power channel of the redundancy memory block 221 receiving the power P8 can be turned on.

According to the foregoing description, when one of the memory blocks 210 to 217 is failed, the interface circuits 230 to 237 can skip the failed memory blocks and sequentially select normal memory blocks and redundancy memory blocks 221 to be coupled to the corresponding pads. In this way, a normal memory block can be provided to perform the access action, and the repair operation can be completed simply and quickly. On the other hand, the power channel of the memory block that is determined to be failed can be cut off, and unnecessary power consumption is effectively prevented.

Figure 4A:
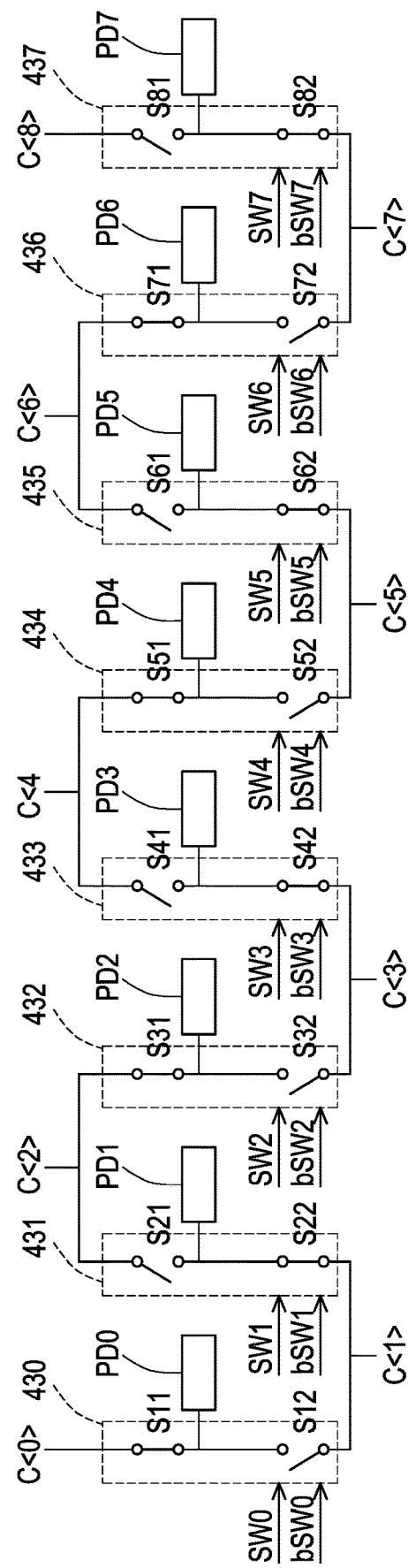
FIG. 4A and FIG. 4B are schematic views of implementations of multiple interface circuits according to an embodiment of the disclosure.
Figure 4B:
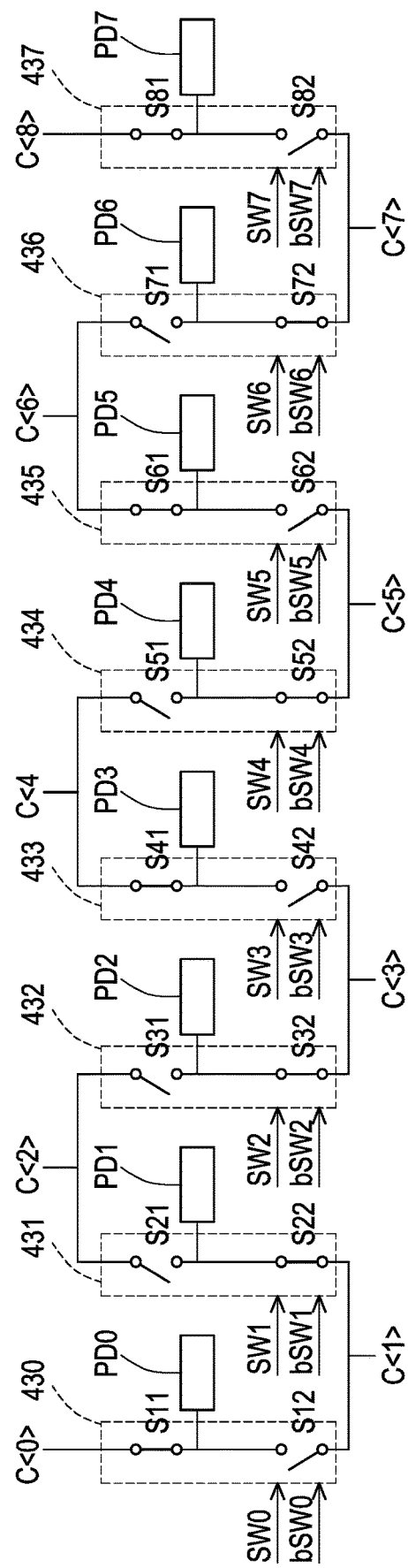

Referring to FIG. 4A and FIG. 4B, FIG. 4A and FIG. 4B are schematic views of implementations of multiple interface circuits according to an embodiment of the disclosure. In FIG. 4A, the interface circuits 430 to 437 are connected in series with one another. Each of the interface circuits 430 to 437 includes two switches connected in series between two memory channels, and the interface circuit 430 includes switches S11 and S12; the interface circuit 431 includes switches S21 and S22; the interface circuit 432 includes switches S31 and S32; the interface circuit 433 includes switches S41 and S42; the interface circuit 434 includes switches S51 and S52; the interface circuit 435 includes switches S61 and S62; the interface circuit 436 includes switches S71 and S72; the interface circuit 437 includes switches S81 and S82. Interface circuits 430 to 437 are coupled between memory channels C<0> and C<1>, between memory channels C<1> and C<2>, between memory channels C<2> and C<3>, between memory channels C<3> and C<4>, between memory channels C<4> and C<5>, between memory channels C<5> and C<6>, between memory channels C<6> and C<7>, and between memory channel C<7> and C<8>, respectively. The memory channels C<0> to C<7> are respectively configured to be coupled to multiple memory blocks, and the memory channel C<8> is configured to be coupled to the redundancy memory block.

On the other hand, the interface circuits 430 to 437 are coupled to the solder pads PD0 to PD7, respectively. The switches S11, S22, 531, S42, S51, S62, 571, and S82 are respectively controlled by the reverse signals bSW0 to bSW7, and the switches 512, 521, S32, 541, S52, 561, S72, and S81 are respectively controlled by the selection signals SW0 to SW7.

In FIG. 4A, when the memory blocks are normal, the switches S11, S22, S31, S42, S51, S62, 571, and S82 are turned on, and the switches 512, 521, S32, 541, S52, 561, S72, and S81 are cut off. The interface circuits 430 to 437 respectively couple the memory channel C<0> to the solder pad PD0; couple the memory channel C<1> to the solder pad PD1; couple the memory channel C<2> to the solder pad PD2; couple the memory channel C<3> to the solder pad PD3; couple the memory channel C<4> to the solder pad PD4; couple the memory channel C<5> to the solder pad PD5; couple the memory channel C<6> to the solder pad PD6; couple the memory channel C<7> to the solder pad PD7. In this way, multiple memory blocks respectively coupled to the memory channels C<0> to C<7> can be provided to perform the data access action.

In addition, in FIG. 4B, the memory block connected to the memory channel C<2> as the failed memory block is taken as an example for illustration. Meanwhile, the switches S11, S22, S32, S41, S52, S61, S72, and S81 are turned on, and the switches S12, S21, S31, S42, S51, S62, S71, and S82 are turned off. The interface circuits 430 to 437 respectively couple the memory channel C<0> to the solder pad PD0; couple the memory channel C<1> to the solder pad PD1; couple the memory channel C<3> to the solder pad PD2; couple the memory channel C<4> to the solder pad PD3; couple the memory channel C<5> to the solder pad PD4; couple the memory channel C<6> to the solder pad PD5; couple the memory channel C<7> to the solder pad PD6; couple the memory channel C<8> to the solder pad PD7. That is, the interface circuits 430 to 437 can isolate the failed memory block from the solder pads PD1 and PD2, and enable the not failed memory block and the redundancy memory block to be sequentially coupled to the solder pads PD0 to PD7 to complete the repairing action.

Figure 5:
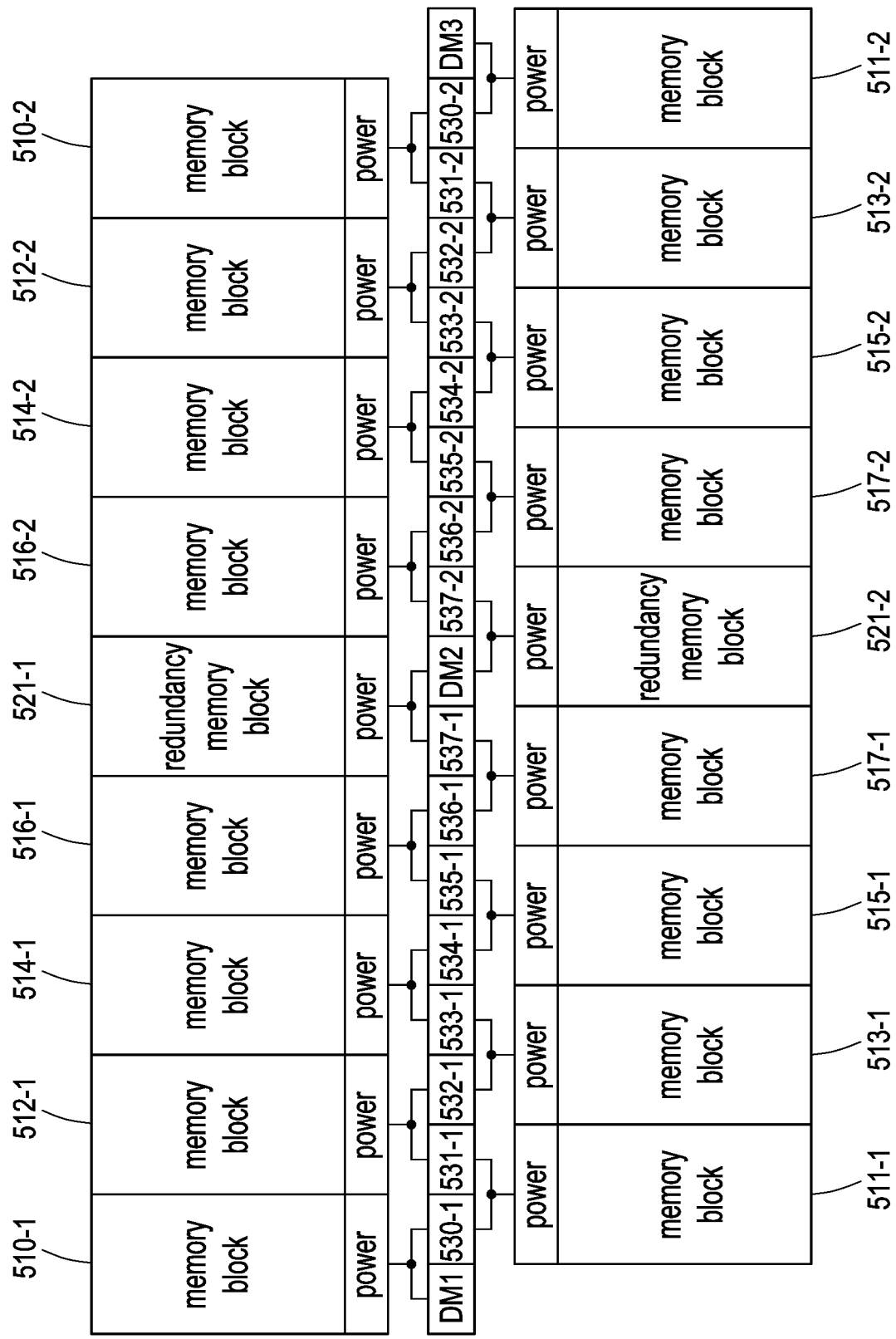

Referring to FIG. 5, FIG. 5 is a schematic view of a multi-channel memory device according to another embodiment of the disclosure. Different from the foregoing embodiment, in the embodiment, a multi-channel memory 500 includes multiple redundancy memory blocks 521-1 and 521-2. The redundancy memory block 521-1 is in cooperation with the memory blocks 510-1 to 517-1 and the interface circuits 530-1 to 537-1 to form a first group of circuits for operation, and the redundancy memory block 521-2 is in cooperation with the memory blocks 510-2 to 517-2 and the interface circuits 530-2 to 537-2 to form a second group of circuits for operation.

In the embodiment, the first group of circuits and the second group of circuits can independently perform the repair operation of the memory block. The operation manners of the repair operations of the first group of circuits and the second group of circuits are the same as the foregoing embodiments and implementations, which are not repeated herein.

In addition, in other embodiments of the disclosure, the number of the memory blocks in the first group of circuits may be N, the number of the memory blocks in the second group of circuits may be M, and the values of N and M may be the same, or may not be the same.

In the embodiment, the multi-channel memory 500 further includes the redundant interface circuits DM1, DM2, and DM3. The redundant interface circuit DM1 is disposed on one side of the interface circuit 530-1 and coupled to the memory block 510-1. The redundant interface circuit DM2 is disposed between the interface circuits 537-1 and 537-2 and coupled to the redundancy memory blocks 521-1 and 521-2. The redundant interface circuit DM3 is disposed on one side of the interface circuit 530-2 and coupled to the memory block 511-2. The circuit structures of the redundant interface circuits DM1, DM2, and DM3 are all the same. Each circuit structure of the redundant interface circuits DM1, DM2, and DM3 is also the same as each circuit structure of the memory blocks 510-1 to 517-2. The redundant interface circuits DM1, DM2, and DM3 are configured to balance the load of the memory blocks 510-1 to 517-2 and the redundancy memory blocks 521-1 and 521-2 and improve the performance of the multi-channel memory 500.

Meanwhile, according to the embodiment of FIG. 5, the multi-channel memory 500 of the disclosure can be constructed by applying more groups of circuits, and more redundancy memory blocks can be provided to perform the replacement of the failed memory blocks to improve the repair ability of the multi-channel memory 500.

In summary, with multiple interface circuits connected in series, the disclosure switches the coupling relationship between the memory block and the redundancy memory block and the input and output interfaces when the memory block is failed, the failed memory block can be isolated and cannot be accessed, and the repair operation of the multi-channel memory device can be completed quickly.

What is claimed is:

1. A multi-channel memory device, comprising:
   N first memory blocks, where N is a positive integer greater than 1;
   a first redundancy memory block;
   N first interface circuits, wherein each of the first interface circuits is coupled to two of the first memory blocks and the first redundancy memory block, and each of the first interface circuits selects each of N first selected memory blocks in the first memory blocks and the first redundancy memory block to be coupled to a plurality of first input and output interfaces according to a plurality of first selection signals; and a decoder coupled to the storage and generating the first selection signals according to decoded error information, wherein the decoder generates a plurality of power control signals according to the decoded error information, and each of the first interface circuits turns on or cuts off power of each of the first memory blocks and the first redundancy memory block according to each of the power control signals.

2. The multi-channel memory device according to claim 1, wherein an i-th first interface circuit selects an i-th first memory block or an i+1-th first memory block according to an i-th first selection signal to be coupled to an i-th first input and output interface, and i is a positive integer greater than 0 and less than N.

3. The multi-channel memory device according to claim 2, wherein an N-th first interface circuit selects an N-th first memory block or the first redundancy memory block according to an N-th first selection signal to be coupled to an N-th first input and output interface.

4. The multi-channel memory device according to claim 1, further comprising:
a storage storing error information of an error status of each of the first memory blocks.

5. The multi-channel memory device according to claim 4, wherein when none of the memory blocks is failed, the power control signal corresponding to the first redundancy memory block is at a non-active logic level.

6. The multi-channel memory device according to claim 4, wherein when one of the memory blocks is failed, the power control signal corresponding to the first redundancy memory block is at an active logic level.

7. The multi-channel memory device according to claim 4, wherein the storage is a fuse circuit.

8. The multi-channel memory device according to claim 7, wherein circuit structures of the first redundant interface circuit and the second redundant interface circuit are the same as a circuit structure of each of the first interface circuits.

9. The multi-channel memory device according to claim 1, wherein power channel of a failed memory block of the first memory blocks is cut off according to the corresponding power control signal by the corresponding first interface circuit.

10. The multi-channel memory device according to claim 1, wherein the power control signals are respectively same as the corresponding selection signals.

11. The multi-channel memory device according to claim 1, further comprising:
a first redundant interface circuit and a second redundant interface circuit,
wherein the first interface circuits are disposed in a row, and the first redundant interface circuit and the second redundant interface circuit are disposed on two sides of the row, respectively.

12. The multi-channel memory device according to claim 1, wherein an i-th first interface circuit comprises:
a first switch coupled between a corresponding i-th first memory block and a corresponding i-th first input and output interface and controlled by a reverse signal of a corresponding i-th first selection signal; and
a second switch coupled between a corresponding i+1-th first memory block and the i-th first input and output interface and controlled by the i-th first selection signal,
wherein on and off states of the first switch and the second switch are opposite, and i is a positive integer greater than 0 and less than N.

13. The multi-channel memory device according to claim 1, wherein an N-th first interface circuit comprises:
a first switch coupled between a corresponding N-th first memory block and a corresponding N-th first input and output interface and controlled by a reverse signal of a corresponding N-th first selection signal; and
a second switch coupled between the corresponding first redundancy memory block and the N-th first input and output interface and controlled by the N-th first selection signal,
wherein on and off states of the first switch and the second switch are opposite.

14. The multi-channel memory device according to claim 1, further comprising:
M second memory blocks, where M is a positive integer greater than 1;
a second redundancy memory block; and
M second interface circuits, wherein each of the second interface circuits is coupled to two of the second memory blocks and the second redundancy memory block, and the second interface circuits respectively select N second selected memory blocks in the second memory blocks and the second redundancy memory block to be coupled to a plurality of second input and output interfaces according to a plurality of second selection signals.

15. The multi-channel memory device according to claim 14, wherein N and M are equal or different.

16. The multi-channel memory device according to claim 1, wherein the first input and output interfaces are solder pads.

* * * * *